(12) United States Patent
Kawanishi et al.

(10) Patent No.: US 9,633,817 B2
(45) Date of Patent: Apr. 25, 2017

(54) DIAPHRAGM MOUNTING MEMBER AND CHARGED PARTICLE BEAM DEVICE

(71) Applicant: Hitachi High-Technologies Corporation, Tokyo (JP)

(72) Inventors: Shinsuke Kawanishi, Tokyo (JP); Yusuke Ominami, Tokyo (JP); Hiroyuki Suzuki, Tokyo (JP); Masahiko Ajima, Tokyo (JP)

(73) Assignee: Hitachi High-Technologies Corporation, Tokyo (JP ( * ) Notice: Subject to any disclaimer, the term of this patent is extended or adjusted under 35 U.S.C. 154(b) by 0 days.

(21) Appl. No.: 14/911,681

(22) PCT Filed: Mar. 10, 2014

(86) PCT No.: PCT/JP2014/056095
§ 371 (c)(1),
(2) Date: Feb. 11, 2016

(87) PCT Pub. No.: WO2015/025545
PCT Pub. Date: Feb. 26, 2015

(65) Prior Publication Data
US 2016/0203941 A1    Jul. 14, 2016

(30) Foreign Application Priority Data

Aug. 23, 2013   (JP) .................................. 2013-172823

(51) Int. Cl.
*H01J 37/00*   (2006.01)
*H01J 37/20*   (2006.01)
(Continued)

(52) U.S. Cl.
CPC ............... *H01J 37/20* (2013.01); *G01M 3/02* (2013.01); *H01J 37/16* (2013.01); *H01J 37/18* (2013.01);
(Continued)

(58) Field of Classification Search
CPC .. H01J 37/20; H01J 37/28; H01J 37/26; H01J 37/16; H01J 37/18; H01J 2237/2802;
(Continued)

(56) References Cited

U.S. PATENT DOCUMENTS

2004/0046120 A1* 3/2004 Moses ...................... H01J 37/20
250/311
2010/0243888 A1   9/2010 Nishiyama et al.
(Continued)

FOREIGN PATENT DOCUMENTS

DE   11 2012 003 182 T5   4/2014
DE   11 2013 003 552 T5   4/2015
(Continued)

OTHER PUBLICATIONS

First Office Action issued in counterpart German Application No. 11 2014 003 268.9 dated Feb. 29, 2016 with English translation (15 pages).
(Continued)

*Primary Examiner* — Michael Maskell
(74) *Attorney, Agent, or Firm* — Crowell & Moring LLP

(57) ABSTRACT

Conventional devices have been difficult to use due to insufficient consideration being given to factors such as the cost necessary for diaphragm replacement and the convenience of the work. In the present invention, a diaphragm mounting member installed in a charged particle beam device for radiating a primary charged particle beam through a diaphragm separating a vacuum space and an atmospheric pressure space onto a sample placed in the atmospheric pressure space is provided with a diaphragm installation portion to which a TEM membrane is mounted and a casing fixing portion mounted on a casing of the charged particle beam device. The diaphragm installation portion has a positioning structure for positioning a platform on which the diaphragm is held.

16 Claims, 10 Drawing Sheets

(51) Int. Cl.
  *H01J 37/28* (2006.01)
  *G01M 3/02* (2006.01)
  *H01J 37/26* (2006.01)
  *H01J 37/18* (2006.01)
  *H01J 37/16* (2006.01)

(52) U.S. Cl.
  CPC .............. *H01J 37/26* (2013.01); *H01J 37/28* (2013.01); *H01J 2237/188* (2013.01); *H01J 2237/2002* (2013.01); *H01J 2237/2006* (2013.01); *H01J 2237/2605* (2013.01); *H01J 2237/2802* (2013.01)

(58) Field of Classification Search
  CPC ....... H01J 2237/2002; H01J 2237/2006; H01J 2237/2605; H01J 2237/188; G01M 3/02
  USPC ........................................ 250/440.11–442.11
  See application file for complete search history.

(56) References Cited

U.S. PATENT DOCUMENTS

| | | | |
|---|---|---|---|
| 2011/0284745 A1* | 11/2011 | Nishiyama | G01N 23/2204 250/307 |
| 2012/0006784 A1 | 1/2012 | Lin et al. | |
| 2014/0021347 A1 | 1/2014 | Ominami et al. | |
| 2014/0151553 A1 | 6/2014 | Ominami et al. | |
| 2015/0221470 A1 | 8/2015 | Ominami et al. | |

FOREIGN PATENT DOCUMENTS

| | | | |
|---|---|---|---|
| JP | 2008-16249 A | | 1/2008 |
| JP | 2010-230417 A | | 10/2010 |
| JP | 2011-129443 A | | 6/2011 |
| JP | 2011129443 A | * | 6/2011 |
| JP | 2011-243483 A | | 12/2011 |
| JP | 2012-18926 A | | 1/2012 |
| JP | 2012-68033 A | | 4/2012 |
| JP | 2012-221766 A | | 11/2012 |
| WO | WO 2010/001399 A1 | | 1/2010 |
| WO | WO 2013/042425 A1 | | 3/2013 |

OTHER PUBLICATIONS

International Search Report (PCT/ISA/210) issued in PCT Application No. PCT/JP2014/056095 dated May 13, 2014 with English translation (six pages).
Japanese-language Written Opinion (PCT/ISA/237) issued in PCT Application No. PCT/JP2014/056095 dated May 13, 2014 (five pages).

* cited by examiner

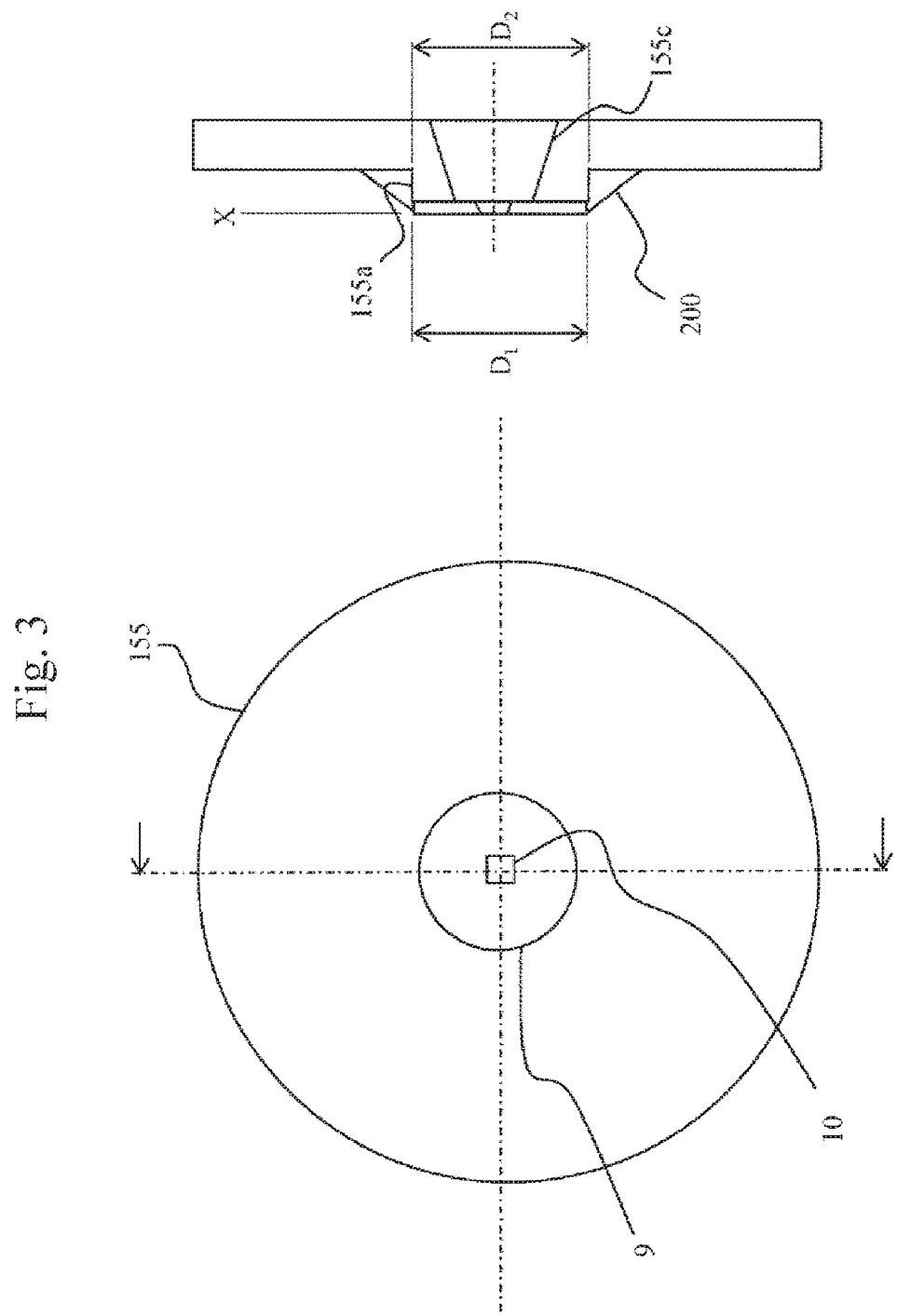

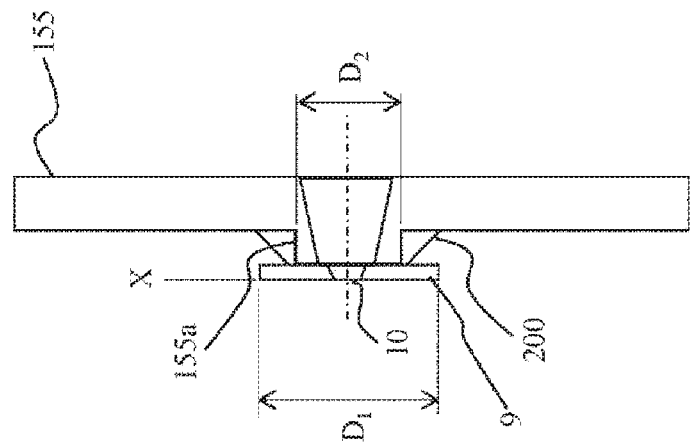
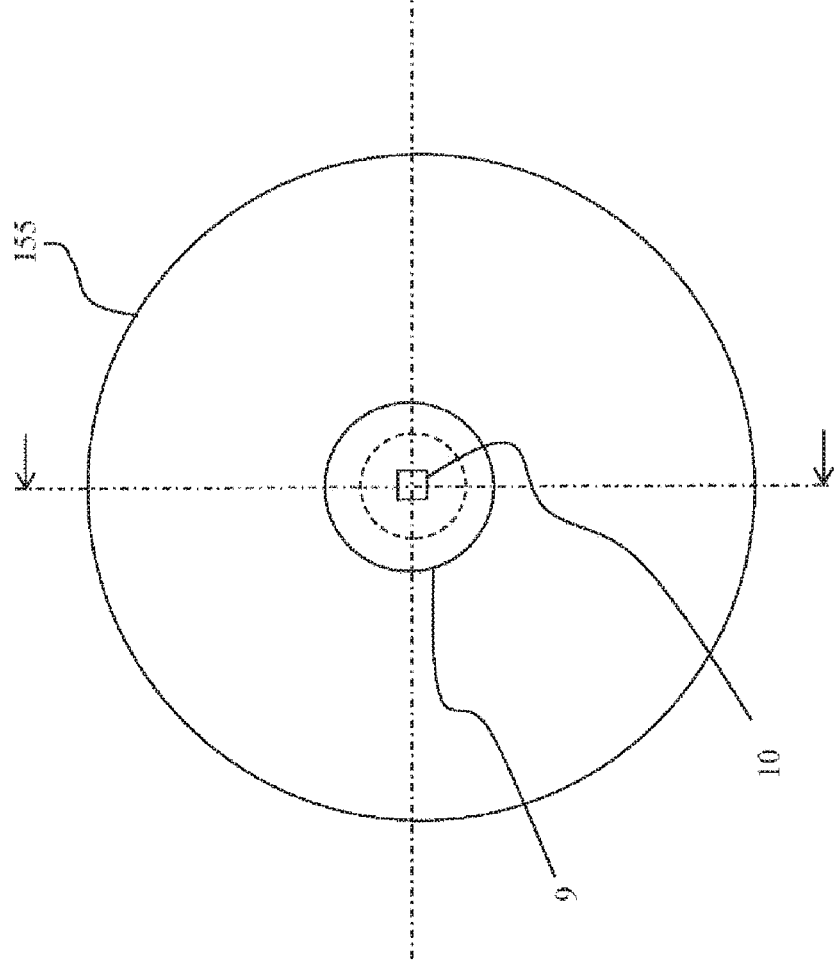
Fig. 4

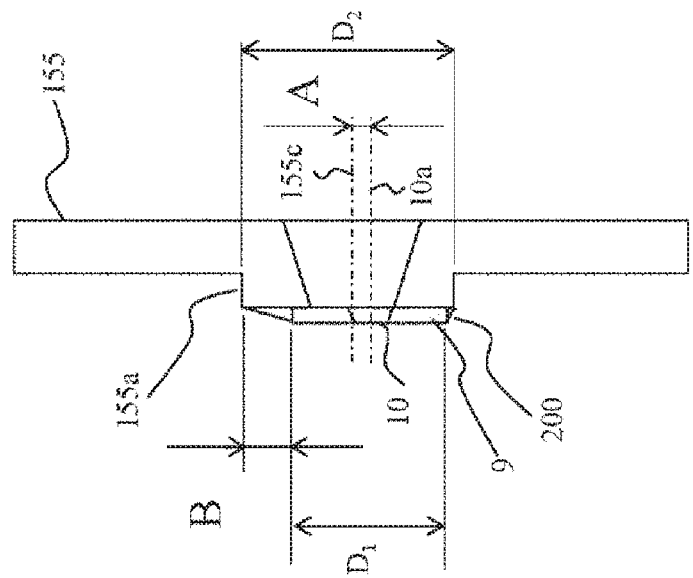
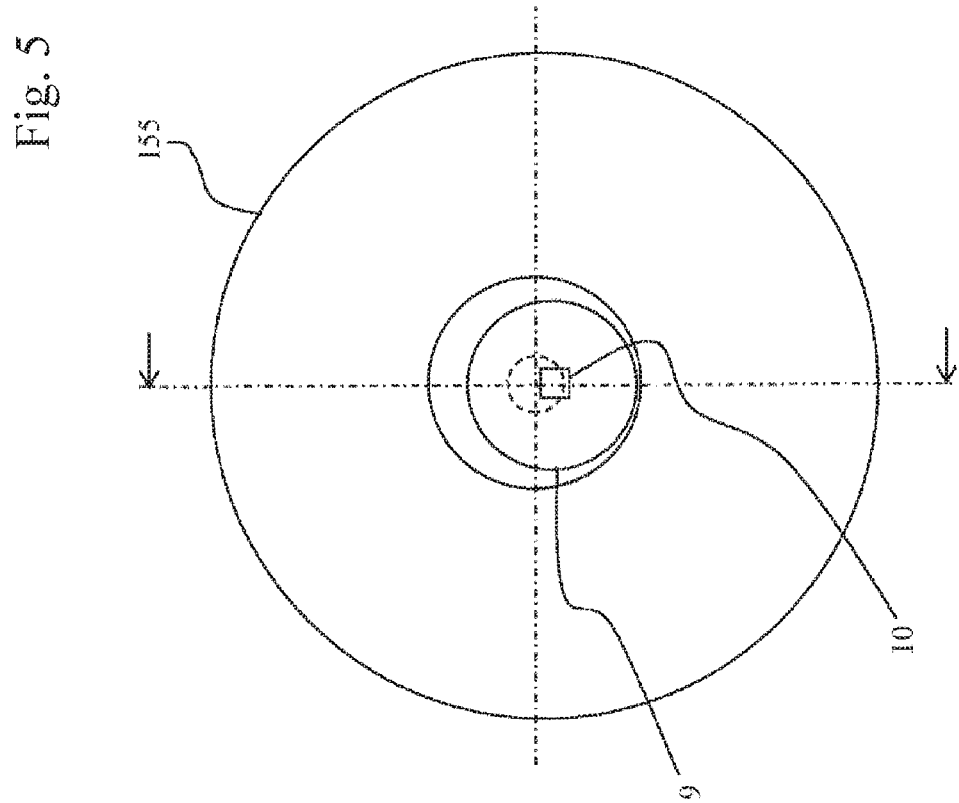
Fig. 5

DIAPHRAGM MOUNTING MEMBER AND CHARGED PARTICLE BEAM DEVICE

TECHNICAL FIELD

The present invention relates to a charged particle beam apparatus in which observation can be performed under a predetermined gas atmosphere in a state of atmospheric pressure or slightly negative pressure compared to the atmospheric pressure.

BACKGROUND ART

In order to observe a fine region of an object, a scanning electron microscope (SEM), a transmission electron microscope (TEM), or the like is used. In general, in these apparatuses, a housing, in which a sample is disposed, is subjected to evacuation of air, an atmosphere of the sample is in a vacuum state, and then the sample is imaged. However, a biological or chemical sample, a liquid sample, or the like is damaged, or a state thereof is changed, in a vacuum state. On one hand, there have been increased needs for observing such samples by using an electron microscope and, recently, an SEM apparatus, in which an observation target sample can be observed under atmospheric pressure, has been developed.

PTL 1 discloses an SEM apparatus in which observation can be performed under atmospheric pressure. Since a diaphragm, which can transmit an electron beam, is provided between an electron optical system and a sample such that a vacuum state and an atmospheric state are separated in principle, this apparatus is different from an observation technique for an environmental cell or the like in that the sample approaches the diaphragm such that an observation is performed in a non-contact state.

CITATION LIST

Patent Literature

PTL 1: JP-A-2012-221766

SUMMARY OF INVENTION

Technical Problem

In the SEM apparatus in which the observation can be performed under atmospheric pressure, when the sample is brought into contact with the diaphragm due to an error in an operation, the diaphragm is contaminated or broken in some cases. In the case where the diaphragm is contaminated or broken, the diaphragm needs to be replaced.

The diaphragm needs to be thin to the extent that a charged particle beam is transmitted therethrough and to have durability to the extent that a vacuum and an atmospheric pressure environment are separated, and thus advanced technology is required to produce the diaphragm. Therefore, a diaphragm exclusive to the SEM apparatus, in which observation can be performed under atmospheric pressure, is manufactured at a high cost and, as a result, the diaphragm is costly despite being an expendable component.

In addition, the diaphragm is included in a tiny base and it is difficult to handle the diaphragm as a single body. In PTL 1, the diaphragm is configured to be fixed to a holding member and the holding member is removed as is from the SEM apparatus in which observation is performed under atmospheric pressure such that the diaphragm is easily handled. However, there is no description of problems of complicated operations such as attachment of the diaphragm to the holding member. The attachment operation of the diaphragm to the holding member has to be carefully performed because there is a possibility that openings of the diaphragm and the diaphragm holding member will be eccentrically disposed. When the openings of the diaphragm and the diaphragm holding member are eccentrically disposed, there is a concern that the performance of the SEM apparatus will be degraded because a part or a whole of primary and secondary charged particle beams are blocked by the diaphragm holding member when observation is performed using the SEM apparatus under atmospheric pressure by positional matching of the center of the diaphragm and the optical axis of the electron optical system.

As above, for the apparatus in the related art, since no sufficient consideration has been made about the cost, simplicity of an operation, or the like for replacement of the diaphragm, it is difficult to use the apparatus.

The present invention is made in consideration of the problems described above and an object thereof is to provide a charged particle beam apparatus in which it is possible to easily perform a diaphragm attaching operation, in an SEM apparatus in which observation can be performed under atmospheric pressure.

Solution to Problem

In order to solve the problem described above, the present invention provides a diaphragm attaching member which is applied to an SEM apparatus in which a membrane for a TEM can be observed under atmospheric pressure.

In addition, the replacement member has a position matching structure in which the center of the diaphragm is matched to the center of an opening of the replacement member at a portion to which the diaphragm is attached.

Advantageous Effects of Invention

An object of the present invention is to provide a charged particle beam apparatus in which it is possible to perform replacement of a diaphragm in low cost and high workability in an SEM apparatus in which observation can be performed under atmospheric pressure.

Problems, configurations, or effects other than those described above are clearly described in the following embodiment.

FIG. 3 is a detailed view of a diaphragm holding member.

FIG. 4 is a detailed view of another diaphragm holding member.

FIG. 5 is a detailed view of still another diaphragm holding member,

DESCRIPTION OF EMBODIMENTS

Hereinafter, respective embodiments will be described with respect to the drawings.

Hereinafter, as an example of a charged particle beam apparatus, a charged particle beam microscope will be described. However, the charged particle beam microscope is simply an example of the present invention and the present invention is not limited to the following embodiments to be described below. The present invention can also be applied to a scanning electron microscope, a scanning ion microscope, a scanning transmission electron microscope, a composite apparatus of the microscopes and a sample processing apparatus, or an analysis and inspection apparatus to which the above apparatuses are applied.

In addition, "atmospheric pressure" in the present specification is the atmosphere or a predetermined gas atmosphere and means a pressure environment in an atmospheric state or a slightly negative pressure state. Specifically, the atmospheric pressure is about 10 Pa (atmospheric pressure) to $10^3$ Pa.

Example 1

Configuration of Apparatus

Figure 1:
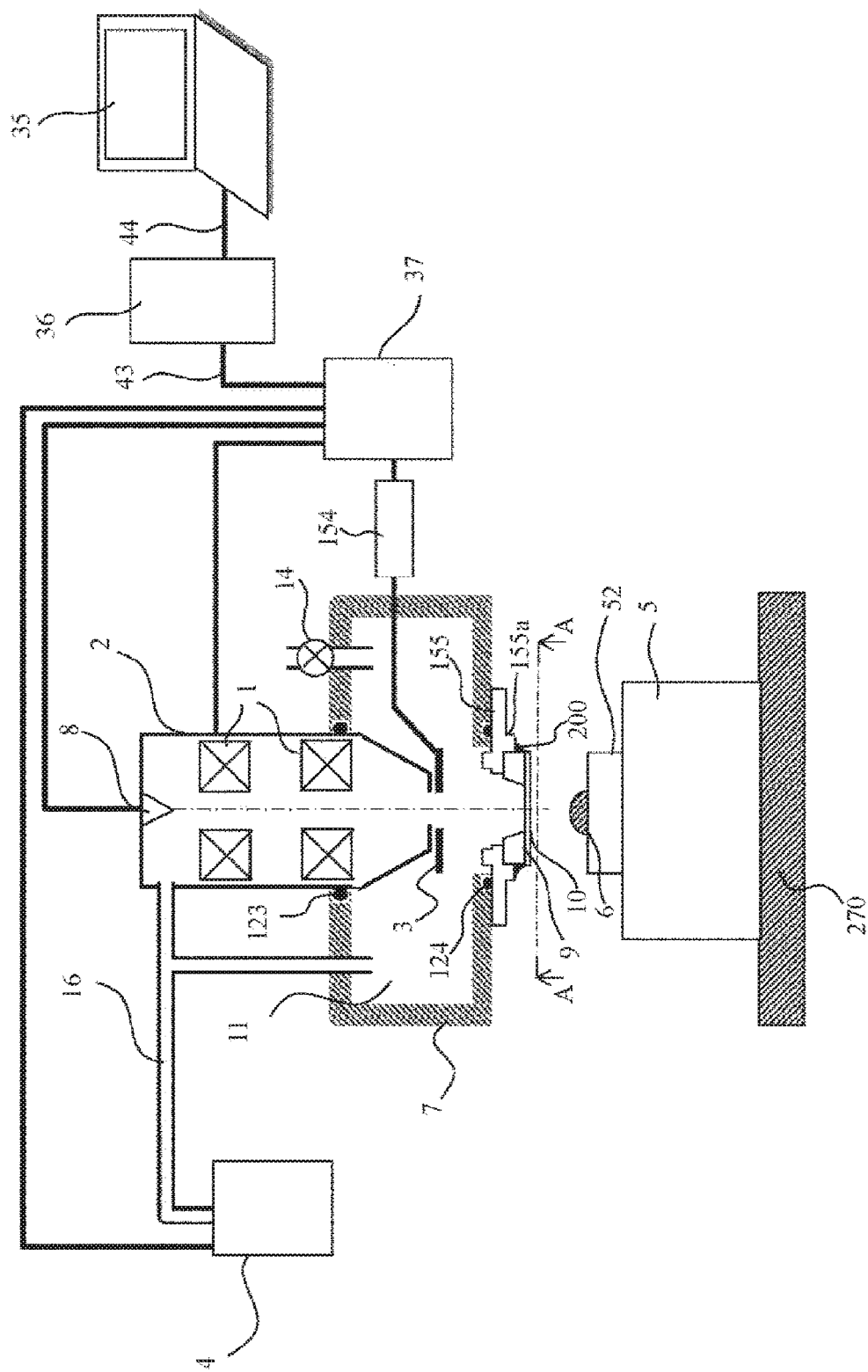
FIG. 1 is a diagram of an entire configuration of a charged particle microscope according to Example 1.

In the present example, a basic embodiment is described. FIG. 1 is a diagram of an entire configuration of a charged particle microscope according to Example 1.

The charged particle microscope illustrated in FIG. 1 is configured to mainly include a charged particle optical lens tube 2, a housing (vacuum chamber) 7 which is connected to and supports the charged particle optical lens tube 2, a sample stage 5 disposed in the atmosphere, and a control system which controls the above components. When the charged particle microscope is used, the inner portions of the charged particle optical lens tube 2 and the housing 7 is subjected to evacuation of air and is in a vacuum state by a vacuum pump 4. Start and stop operations of the vacuum pump 4 are also controlled by the control system. In the drawings, one vacuum pump 4 is illustrated; however, two or more vacuum pumps may be provided. The charged particle optical lens tube 2 and the housing 7 have columns or the like (not illustrated) which are supported by a base 270.

The charged particle optical lens tube 2 is configured to include elements such as a charged particle source 8 which generates a charged particle beam, and an optical lens 1 which focuses and guides the generated charged particle beam to a lower section of the lens tube, and scans a sample 6 with a primary charged particle beam. The charged particle optical lens tube 2 is disposed to protrude to the inner portions of the housing 7 and is fixed to the housing 7 through a vacuum sealing member 123. At the end of the charged particle optical lens tube 2, a detector 3 which detects secondary charged particles (secondary electrons or reflective electrons) which are obtained by irradiation of the primary charged particle beam described above is disposed. The detector 3 may be disposed inside or outside of the charged particle optical lens tube 2. The charged particle optical lens tube may include another lens, another electrode, or another detector other than those described above, a part of configuration may be different from that described above, and the configuration of the charged particle optical system included in the charged particle optical lens tube is not limited thereto.

The charged particle microscope of the present example includes, as a control system, a computer 35 which is used by an apparatus user, an high-rank control unit 36 which is connected to the computer 35 and performs communication thereto, and a low-rank control unit 37 which performs control of a vacuum evacuating system or a charged particle optical system in response to an instruction transmitted from the high-rank control unit 36. The computer 35 includes a monitor on which an operation screen (GUI) of the apparatus is displayed and an input means to the operation screen, such as a keyboard or a mouse. The high-rank control unit 36, the low-rank control unit 37, and the computer 35 are connected by various communication lines 43 and 44.

The low-rank control unit 37 is a section which transmits and receives a control signal for controlling the vacuum pump 4, the charged particle source 8, or the optical lens 1 and, further, the low-rank control unit converts an output signal of the detector 3 into a digital image signal and transmits the digital image signal to the high-rank control unit 36. In the drawings, an output signal from a detector 3 is connected to the low-rank control unit 37 through an amplifier 154 such as a preamplifier. If the amplifier is not necessary, the amplifier may not be provided.

The high-rank control unit 36 and the low-rank control unit 37 may include an analog circuit with a digital circuit together, or the high-rank control unit 36 and the low-rank control unit 37 may be united as a one unit. The charged particle microscope may include a control unit which controls an operation of the respective components in addition to the components described above. The high-rank control unit 36 and the low-rank control unit 37 may be configured as hardware by a dedicated circuit board or may be configured as software which is executed by a computer 35. In a case where the control units are configured as hardware, the control units can be realized by a plurality of computing units mounted on an interconnection substrate, or by being integrated in a semiconductor chip or a package. In a case where the control units are configured as software, a high-speed general-purpose CPU is mounted on the computer and the control units can be realized by executing a program which executes a desirable computing process. Further, the configuration of the control system illustrated in FIG. 1 is only an example, modification examples of a control unit, a valve, a vacuum pump, or a communication line belongs to a category of the SEM to the charged particle beam apparatus of the present example, as long as the modification examples satisfy an intended function in present example.

The vacuum pipe 16 has one end connected to the vacuum pump 4 and is connected to the housing 7 and the inside thereof is maintained to be in the vacuum state. Meanwhile, a leak valve 14, which opens the inside of the housing to the atmosphere, is provided and it is possible to open the inside of the housing 7 to the atmosphere during the maintenance or the like. The leak valve 14 may not be provided or two or more leak valves 14 may be provided. In addition, a position of the housing 7, at which the leak valve 14 is disposed, may be changed to another position on the housing 7 without being limited to the positions illustrated in FIG. 1.

A diaphragm 10 is provided at a position right below the charged particle optical lens tube 2 described above on the lower surface of the housing. The diaphragm 10 can transmit or allow a primary charged particle beam which is released from the lower end of the charged particle optical lens tube 2 to pass and the primary charged particle beam eventually reaches the sample 6 mounted on a sample base 52 through the diaphragm 10. A closed space (that is, the inner portions of the charged particle optical lens tube 2 and the housing 7) which is configured by being separated by the diaphragm 10 can be evacuated to be in a vacuum state. In the present example, since the space which is evacuated to be in a vacuum state is maintained in an airtight state by the diaphragm 10, it is possible to maintain the charged particle optical lens tube 2 in the vacuum state and it is possible to maintain the sample 6 in the atmospheric pressure and perform observation of the sample. In addition, since the space, in which the sample is disposed, is in the atmosphere even in a state in which irradiation is performed with the charged particle beam or the space communicates with a space in the atmosphere, it is possible to freely replace the sample 6 during the observation.

<Diaphragm and Diaphragm Attaching Member>

The diaphragm 10 is formed or deposited on the base 9. The diaphragm 10 is formed of a carbon material, an organic material, a metal material, silicon nitride, silicon carbide, oxide silicon, or the like. The base 9, for example, is a silicon or metal member. The diaphragm 10 section may be arranged multiple windows. A thickness of the diaphragm which can transmit or allow the primary charged particle beam to pass is about several nm to several μm. It is necessary that the diaphragm is not damaged under differential pressure for separating the atmospheric pressure from the vacuum. Therefore, an area of the diaphragm 10 is about tens of μm to several mm at most.

Normally, the diaphragm 10 is available in the market in a state of being held in the base 9. A user of the charged particle microscope purchases a diaphragm in a state in which the diaphragm is held in the base 9 and the diaphragm is attached to the housing of the charged particle microscope through the diaphragm holding member 155.

As described above, the diaphragm needs to be thin to the extent that a charged particle beam is transmitted therethrough and to have durability to the extent that a vacuum and an atmospheric pressure environment are separated such that a diaphragm exclusive to the SEM apparatus, in which observation can be performed under atmospheric pressure, is manufactured in high cost and, as a result, the diaphragm is costly as an expendable component.

Thus, in the present example, a case where a thin film, which is available in general, is used as the diaphragm 10 for a membrane in an environmental cell of a transmission electron microscope (TEM) is described. The membrane for the TEM is a thin film formed of SiN or the like on the base (grid) such as an Si material, having a size of about ϕ3 mm and a thickness of about 200 μm. The membrane for the TEM is manufactured to match a shape of a TEM holder. Therefore, in a case where the membrane for the TEM is a circle, the diameter thereof is about 3 mm, in a case of a rectangular shape, the maximum length of the diagonal is about 3 mm, and the thickness is about 200 μm. Here, the size and thickness of the membrane for the TEM have a manufacturing error and, for example, about 3 mm means from 2.8 mm to 3.2 mm. Since the thin film of the membrane for the TEM transmits the charged particle beam and has durability with which the thin film separates a vacuum space from a non-vacuum space, it is possible for the thin film to be applied to the charged particle microscope of the present example. In addition, multiple types of membranes for the TEM are available and a user can freely select a shape, the number thereof, or material properties of the diaphragm section.

However, a structure of a common charged particle microscope is greatly different from the charged particle microscope of the present example, particularly, from the scanning electron microscope, and it is difficult for the membrane for the TEM to be attached to the charged particle microscope of the present example. In addition, if the membrane is attached, an attachment operation is complicated and inconvenient.

Thus, a diaphragm attaching member (also referred to as a diaphragm holding member or a connection member) which attaches the membrane for the TEM to the charged particle microscope of the present invention and, particularly, to the scanning electron microscope is described.

The diaphragm attaching member of the present example has a diaphragm mounting portion to which the membrane for the TEM is attached and a housing fixing portion in which the membrane is attached to the housing of the charged particle beam microscope. An opening is provided in the diaphragm mounting portion at a position right below the diaphragm when the diaphragm is attached. The opening penetrates the diaphragm attaching member in the thickness direction and the charged particle beam passing through the diaphragm is incident to a sample or to a detector through the opening. In addition, it is desirable that an area of the opening on the side of the surface, on which the diaphragm is mounted, is less than an area of the opening on the side of a surface opposite thereto. For example, the opening has a conic shape which is radially widened from the surface on which the diaphragm is mounted. As described above, in a case where the detector is disposed on the side opposite to the sample with the diaphragm interposed therebetween, it is possible to efficiently detect secondary charged particles generated from the sample due to such a shape of the opening.

As described above, since substantially all of the bases of the membranes for the TEM have the external shape with the longest length of 2.8 mm to 3.2 mm, the diaphragm mounting portion has a size to the extent that the base of the membrane for the TEM with the size can be attached. Specifically, the maximum length of the diagonal of the diaphragm mounting portion may be 2.8 mm to 3.2 mm. For example, as will be described in FIGS. 2 to 4, in a case where the diaphragm mounting portion is a concave portion or a convex portion, the maximum length of the diagonal of the concave portion or the convex portion may be 2.8 mm to 3.2 mm. In addition, as will be described below with respect to FIG. 3, when the membrane for the TEM is used as the diaphragm, the diaphragm mounting portion may have a convex shape. Since the diaphragm attaching member is attached to the housing by using a fixing member such as a screw or a fitting structure, the housing fixing portion needs to have a shape corresponding to an attachment structure which is included to the housing side. Further, the diaphragm attaching member may further be attached to the housing through another member or may configure a part of the housing 7.

<Positioning Structure>

The base 9 that supports the diaphragm 10 is provided to be fixed to the diaphragm holding member 155 in an airtight manner by adhesive 200. In a case where the opening of the diaphragm 10 and the opening of the diaphragm holding member 155 are eccentrically disposed, there is a concern that a part or a whole of primary charged particle beams and secondary charged particle beams which is transmitted through the opening of the diaphragm 10 will be blocked by a structure frame of the diaphragm holding member 155. Hence, the performance of the charged particle microscope, in which an S/N ratio deteriorates, is degraded. Therefore, a positioning structure 155a is provided in the diaphragm holding member 155. For example, the positioning structure 155a is a recessed portion, the base 9 which supports the diaphragm 10 is inserted into the positioning structure 155a, and then it is possible to perform adjusting of the position of the diaphragm 10.

FIG. 2 illustrates views from arrow A-A in FIG. 1. The positioning structure 155a may have a shape which is paired with the external shape of the base 9 and can be set to have any shape by matching the shape of the base 9. For example, as illustrated in FIG. 2a, in a case where the base has a quadrangular shape, the positioning structure 155a may have a recessed shape having two surfaces of the diaphragm holding member 155 which are orthogonal to each other. In other words, the positioning structure 155a is a two-step structure having wall surfaces in a thickness direction (a perpendicular direction to the diaphragm surface) of the diaphragm holding member 155. The recessed shape is formed along two sides orthogonal to the base 9 in a state in which the center of the opening of the diaphragm holding member and the center of the diaphragm 10 are coincident with each other. In this case, while the surface on the diaphragm holding member 155 is brought into contact with and slides on both a side surface of one side in a recessed shape of the positioning structure 155a and a side of the base 9 to move until one side of the base 9 butts on another side of the recessed shape. Therefore, it is possible to attach the base 9 to the same position of the diaphragm holding member for each time of the diaphragm replacement and workability is improved. Further, a crossing angle between the two sides described above is not limited to the right angle and the two sides may have any angles as long as the two sides are not parallel to each other. Even in this case, at least one point of the outer circumference of the base 9 is fixed to be in contact with each of the two sides, and thus the base 9 can be mounted at a predetermined position. In addition, the number of the recessed shapes (step structure) is not limited to two and the recessed shape may be configured to have three or more sides.

Figure 2C:
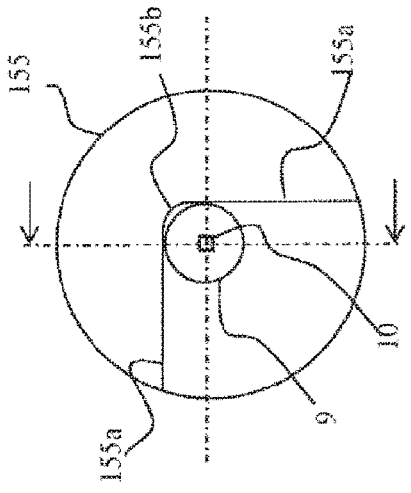
FIGS. 2A-2D illustrate views from arrow A-A in FIG. 1.

As another example, the positioning structure 155a may have a round recess. In this case, four corners of the base 9 may be positioned so as to be mounted on the circumference of the round recess (FIG. 2b). In other words, the round recess of the positioning structure 155a is a concave portion formed of a circular shape having a diameter which is the same as or equivalent to the maximum length of the diagonal of the external shape of the base. Hereinafter, in the present specification, "the same as or equivalent to" means that the members are the same to the extent that the members fit and are joined to each other and permit a dimensional tolerance or a manufacturing error. In a case of an example in FIG. 2b, when the diaphragm holding member 155 is manufactured in a lathe process, it is possible to perform the process of the positioning structure 155a at the same process. Therefore, it is possible to simplify a manufacturing operation and, as a result, it is possible to suppress the cost of the diaphragm holding member to be low.

Figure 2D:
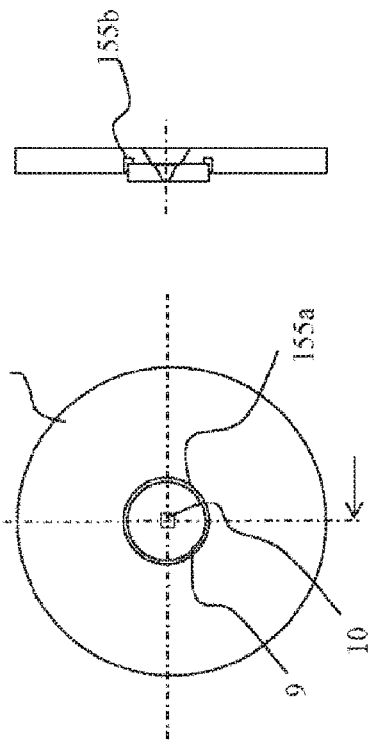
Figure 2A:
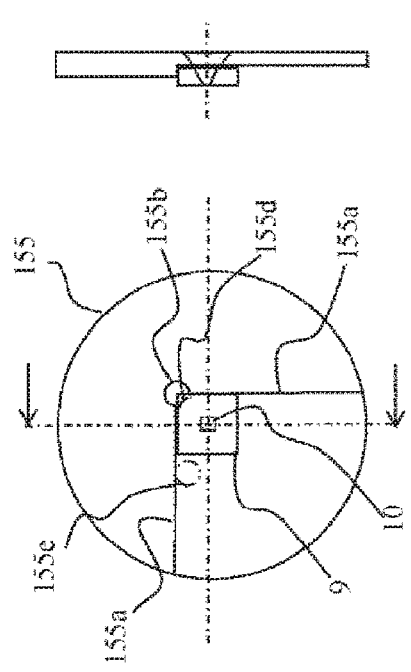
Figure 2B:
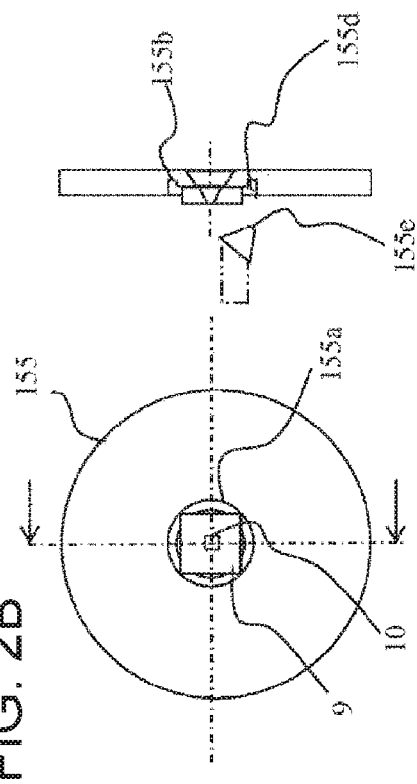

As still another example, even in a case where the base 9 has a round shape, similar to FIGS. 2a and 2b, the base may be configured to come into press contact with two surfaces formed as the positioning structure 155a (FIG. 2c), or the base is fit into the round recess which is a concave portion having the same shape as the external shape of the base 9 (FIG. 2d).

In FIGS. 2a to 2d, it is possible to provide an avoiding shape 155b or the like from a blade during machining. Particularly, in a case of the shape illustrated in FIG. 2a or 2b, the avoiding shape 155b is provided, thereby making it possible to perform the same process as the machining of the diaphragm holding member 155 such as a lathe or a milling machine without using a working process such as electro-discharge machining and it is expected to improve accuracy in dimension or workability. In addition, it is possible to prevent the base 9 from shifting during positioning due to R 155d of an edge produced by a blade edge shape 155e.

FIG. 3 is a view of a configuration in a case where the membrane for the TEM is used for the diaphragm 10. In the charged particle microscope of the configuration, a distance between the diaphragm 10 and the sample 6 needs to short to the extent of about tens of μm. When a projecting object exists on the sample side (on the left side in the right side drawing in FIG. 3) from the diaphragm 10 (that is, X in the drawing), it is not possible to cause the sample 6 to approach the diaphragm 10 and it is difficult to perform the observation through the charged particle microscope. Thus, when the positioning structure 155a is formed of the recess as shown in FIGS. 2a and 2c, the recess has to be formed to have a depth less than the depth of the base 9. However, in a case where the base 9 is thin, the recess needs to be shallower. Therefore, there is a concern that there is a possibility that the base 9 will easily run over the recess and thus it is difficult to position the base. In addition, it is difficult to perform a process of the thin diaphragm holding member 155 such as a process of an extremely shallow recess. For example, the thickness of the base of the membrane for the TEM is 200 μm or the like, thereby causing the problem to outstand.

In order to solve the problem, in a configuration illustrated in FIG. 3, the positioning structure 155a has a protrusion shape protruding on the side on which the diaphragm and the base are attached and the base 9 is provided on a projection portion of the protrusion shape. In other words, the diaphragm holding member is attached such that the projection portion is positioned on the sample side. According to the configuration, the user can easily determine a fixing position of the base 9 with the protrusion shape as a reference. For example, in a case where the base 9 and the positioning structure 155a have a circular shape and the diameter (D1) of the base 9 is the same as or equivalent to (D1≈D2) the diameter (D2) of the positioning structure 155a without a manufacturing error, the base 9 is positioned on the positioning structure 155a and the base 9 and the outer circumferential section of the positioning structure 155a match each other such that it is possible to adjust axes thereof. In a case where the base 9 and the positioning structure 155a have a rectangular shape, the "diameter" described above may be changed as the "maximum length of the diagonal". In the case of other shapes, the "diameter" may be changed to a "length of a long side of a circumscribed rectangle of the external shape of the base 9. Hereinafter, the same is true of description of FIGS. 4 and 5. After the base 9 and the diaphragm holding member 155 are subjected to matching the positions, the base 9 is fixed by the adhesive 200 or the like in an airtight manner. Since a secondary charged particle beam signal is obtained by the detector 3 disposed in a vacuum space, the opening of the diaphragm holding member 155 may be formed to have a tapered shape 155c having a large opening on the charged particle optical lens tube side (right side in the right drawing in FIG. 3). Hence, since the secondary charged particles which can be detected are increased, an S/N ratio of the charged particle beam microscope is improved.

In addition, as illustrated in FIG. 4, the diameter (D1) of the base 9 may be greater (D1>D2) than the diameter (D2) of the positioning structure 155a. When the adhesive 200 or the like is applied, if the adhesive is applied on the base 9 on the diaphragm holding member side, the base 9 plays a role of a "bank" with respect to the adhesive and it is possible to prevent the diaphragm from being contaminated with the adhesive 200 attached or flowing around on the sample side (left side from X in the right drawing in FIG. 3) of the diaphragm 10.

In addition, as illustrated in FIG. 5, the diameter (D1) of the base 9 may be smaller (D1<D2) than the diameter (D2) of the positioning structure 155a. When the base 9 is fixed, the base 9 is fixed such that the base 9 does not project from the surface of the protrusion shape of the positioning structure 155a, which is brought into contact with the base 9. Particularly, the diameter (D2) of the positioning structure 155a may be greater than the external shape (D1) of the base 9 by an amount of a range of limits B (a permissible amount of error of the attachment position of the diaphragm) of a position shifting amount A of the central axis 10a of the diaphragm 10 and the central axis 155c of the opening of the diaphragm holding member 155. The base 9 is disposed so as not to project from the projection portion of the positioning structure, thereby making it possible to easily designate and check a permissible amount of an error in the attachment position of the diaphragm. Further, when the diameter of the positioning structure is increased to exceed the range of limit, it is difficult for the central axes of the diaphragm and the diaphragm holding member to be matched. Therefore, it is desirable that the diameter of the positioning structure is not exceedingly greater than the diameter of the base 9.

In other words, in order to check the permissible range of the position shifting or to prevent the adhesive from flowing around, the size of the positioning structure 155a is adjusted with respect to the base 9, thereby making it possible to exhibit various functions.

<Attachment Jig>

Figure 6:
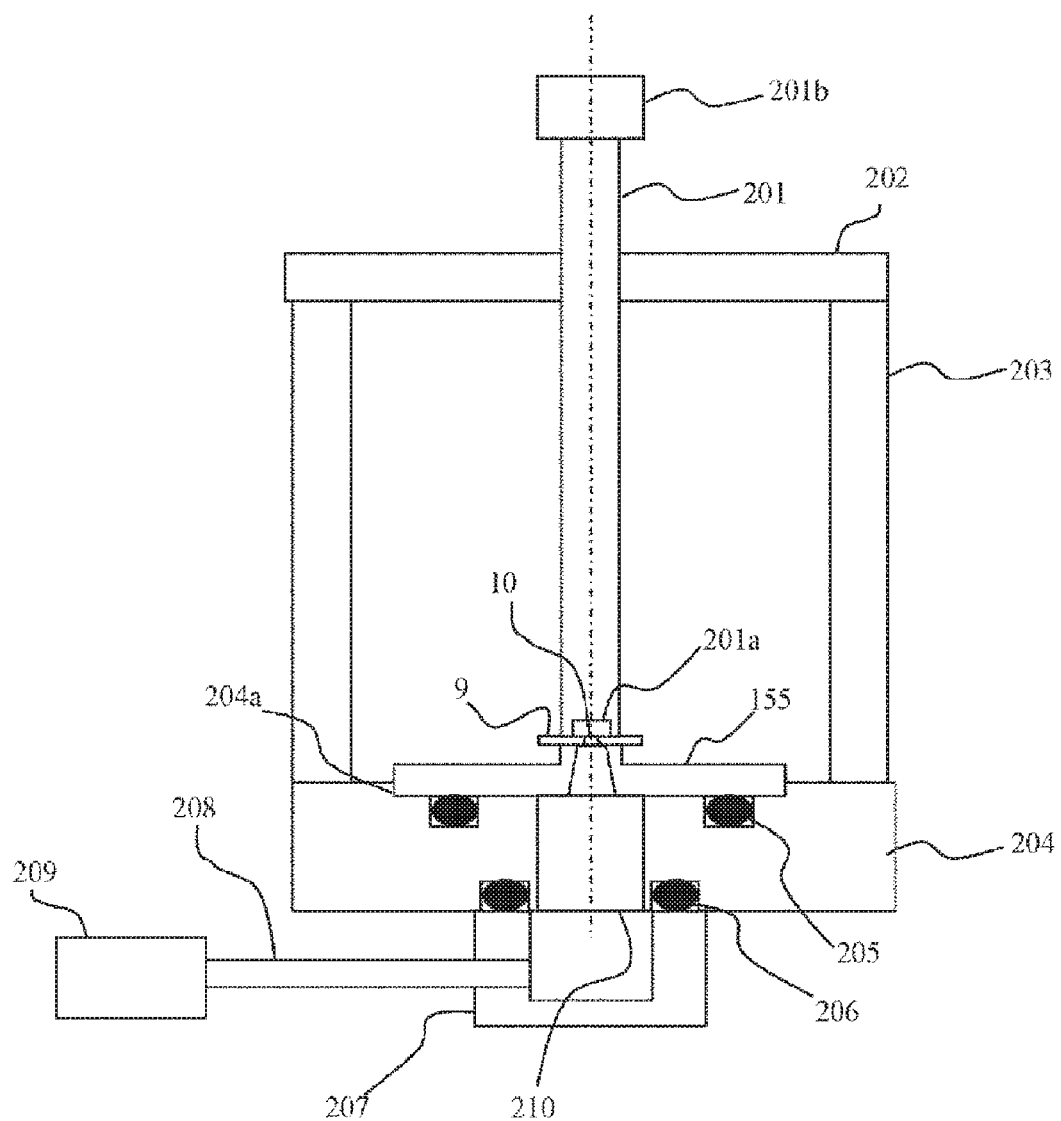
FIG. 6 is a detailed view of an assembly jig.

FIG. 6 is a view of a configuration of a jig when the diaphragm is attached to the diaphragm holding member. The jig is configured to include a pressing member 201 which presses and fixes the diaphragm, structural frames 202 and 203 which support the pressing member, and a base plate 204 that supports the structural frames 202 and 203. The pressing member 201 is mounted perpendicularly above a portion in which the diaphragm holding member is disposed and the pressing member is held by the structural frame 202 so as to be movable in a vertically perpendicular direction illustrated in the drawing. At least an end of the pressing member 201, which faces the diaphragm, needs to move in a perpendicularly vertical direction. The pressing member 201 is caused to move from the perpendicularly upper side to the perpendicularly lower side of the diaphragm holding member 155 and the base 9, thereby making it possible to press the base 9, in which the diaphragm 10 is held, against the diaphragm holding member 155 and to fix the position thereof. At a distal end portion of the pressing member 201, an avoiding section 201a is formed to have a recessed shape at the center thereof. In this manner, the distal end of the pressing member 201 can avoid being brought into contact with the diaphragm 10. In addition, in order to stably apply a load, the pressing member 201 may have a weight 201b.

The base plate 204 has a mounting portion in which the diaphragm holding member 155 is mounted. In the mounting portion, the positioning structure 204a, which performs positioning of the diaphragm holding member 155, is provided. The positioning structure 204a is a groove section which has the same diameter as the diaphragm holding member 155. In this case, the diaphragm holding member is fitted in the groove section, and then it is possible to match the center of the opening of the diaphragm holding member to the central axis of the pressing member 201 of the jig. The positioning structure 204a is not limited thereto, and may be a structure illustrated in FIG. 2. It is important, each time, to match the center of the opening of the diaphragm holding member to the central axis of the pressing member 201.

In FIG. 6, a vacuum sealing member 205 is provided on the bottom of the groove section as the positioning structure 204a. The diaphragm holding member 155 is fitted in the groove section, and airtight sealing is performed by the vacuum sealing member 205 between the diaphragm holding member 155 and the base plate 204. A through-hole 210 is provided in the mounting portion of the base plate 204 for the diaphragm holding member 155. The opening of the through-hole is positioned in a surface facing the diaphragm. It is desirable that the size of the opening is greater than an area of the diaphragm and is smaller than the diaphragm holding member. One end of the through-hole 210 is closed with the disposing of the base 9 in which the diaphragm holding member 155 and the diaphragm 10 are mounted. In addition, a joint 207 is connected to the other end of the through-hole through the vacuum sealing member 206 provided around the opening. A vacuum pump 209 is connected to the joint 207 through the pipe 208. In this manner, in FIG. 6, it is possible to evacuating a space on the lower side from the diaphragm holding member 155. Further, the joint 207 is formed as a part of the base plate 204 and may be configured to directly attach the vacuum pump 209 to the base plate 204. In order to check a degree of vacuum pressure of the space which is subjected to evacuation of air, a pressure of the space, which is subjected to evacuation of air, is measured by a vacuum gauge. The vacuum gauge may be incorporated in the vacuum pump 209 or may be separately provided.

In addition, in the present example, the base 9, in which the diaphragm 10 is held, is disposed on the diaphragm holding member 155, and thus the space subjected to evacuation of air is closed; however, the structure of the jig which performs inspection of the diaphragm is not limited to FIG. 6. The space subjected to evacuation of air becomes a closed space, and then it is noticeable that at least a part of the side surface of the space is configured of the diaphragm.

Further, the structure of the jig is not limited thereto; however, various modifications can be performed. For example, the opening of the base plate 204, through which the evacuation of air is performed, may not positioned right below the diaphragm and a space on the lower side in the drawing from the diaphragm is connected to the vacuum pump and may be maintained in the airtight manner. In addition, the pressing member 201 may not need to have a rod shape but may have an L shape.

The joint 207 may be attachable to and detachable from the base plate 204. The joint 207 is detached when the diaphragm 10 is mounted and it is possible to look in from below in the drawing through the through-hole 210 to check the position of the diaphragm 10. In addition, a mirror or a camera, which monitors the diaphragm 10, may be provided around the through-hole 210 portion. In this manner, it is possible to easily perform a check of a position of the diaphragm 10 during the assembly.

Figure 7:
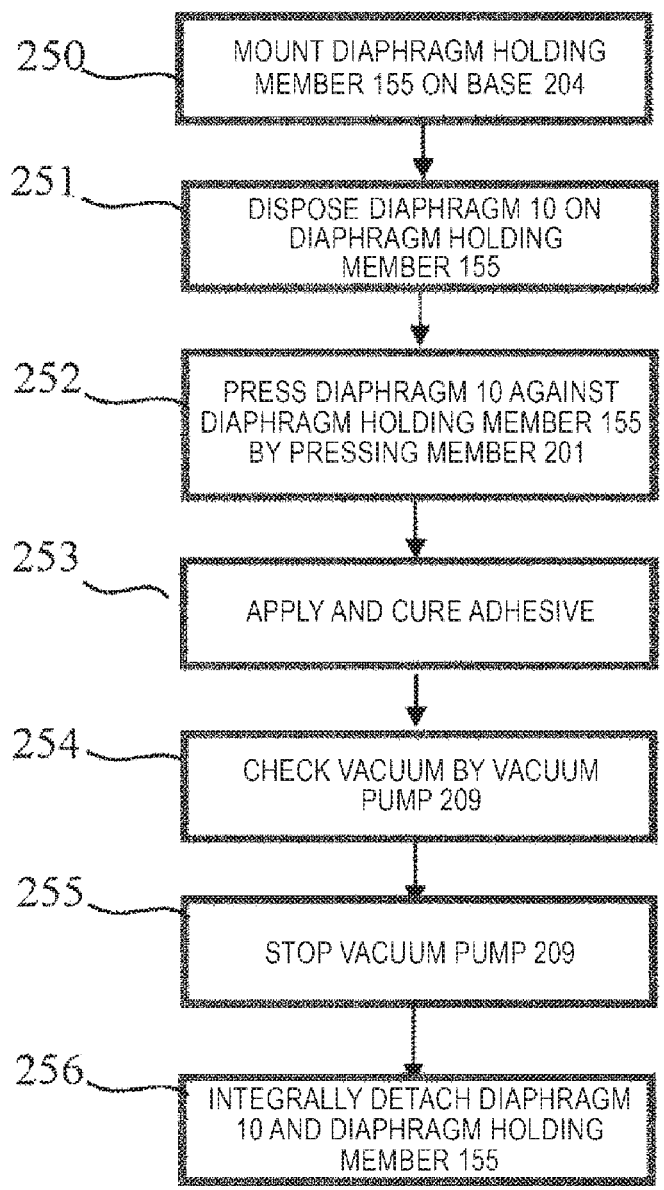
FIG. 7 is a chart showing an assembly operation process.

FIG. 7 is a flowchart showing an assembly flow when the diaphragm 10 is attached to the diaphragm holding member 155. In first Step 250, the diaphragm holding member 155 is set at a predetermined position of the base plate 204. As described above, in the case where the positioning structure 204a is provided on the base plate 204, the diaphragm holding member 155 is disposed at a position which is defined by the positioning structure. In this manner, the diaphragm holding member is in a state of being disposed such that the center of the opening of the diaphragm holding member is positioned on the central axis of the pressing member 201. In second Step 251, the base 9, in a state in which the diaphragm 10 is held, is set on the diaphragm holding member 155. At this time, as described above with reference to FIGS. 2 to 5, the positioning of the diaphragm 10 and the base 9 is performed and the diaphragm 10 and the base 9 are mounted at a predetermined position in the diaphragm holding member 155. In third Step 252, the pressing member 201 moves perpendicularly downward, and thereby the base 9, in which the diaphragm 10 is held, is pressed against and is fixed to the diaphragm holding member 155. In fourth Step 253, the base 9, in which the diaphragm 10 is held, is pressed against the diaphragm holding member 155 by the pressing member 201 and the adhesive is applied and cured between the base 9 and the diaphragm holding member 155.

In fifth Step 254, the vacuum pump 209 is caused to operate, the space (space below the diaphragm 10 in FIG. 6) surrounded by wall surfaces including the diaphragm 10 and the inner wall of the opening of the base plate 204 is subjected to evacuation of air, and the degree of vacuum of the space is checked. Since whether or not the space has a desirable degree of vacuum may be merely checked, the degree of vacuum may not need to be measured with accuracy. As described above, at least a part of the side surface of the space subjected to evacuation of air is formed of the diaphragm 10. Since a sufficient degree of vacuum is not achieved in a case where the diaphragm 10 is damaged or broken, the check operation enables quality confirmation of the diaphragm to be performed. When a broken diaphragm is mounted on the charged particle microscope in error and is subjected to evacuation of air, the sample disperses inside the charged particle optical lens tube and the apparatus is contaminated. In this step, the quality confirmation of the diaphragm is performed such that it is possible to perform a quality check before the diaphragm is attached to the charged particle microscope. Therefore, it is possible to select and to attach a diaphragm, which is reliably durable against differential pressure between the vacuum and the atmospheric pressure, to the charged particle microscope.

In sixth Step 255, the vacuum pump is stopped and the space below the diaphragm 10 in FIG. 6 is opened to the atmosphere. In seventh Step 256, the pressing member 201 is lifted and the diaphragm 10 and the diaphragm holding member 155 are integrally removed. Further, the flow illustrated in the drawing is merely an example and the order may be replaced as appropriate. In this manner, the use of the assembly jig enables the assembly and the inspection of the diaphragm to be simply performed.

Figure 8:
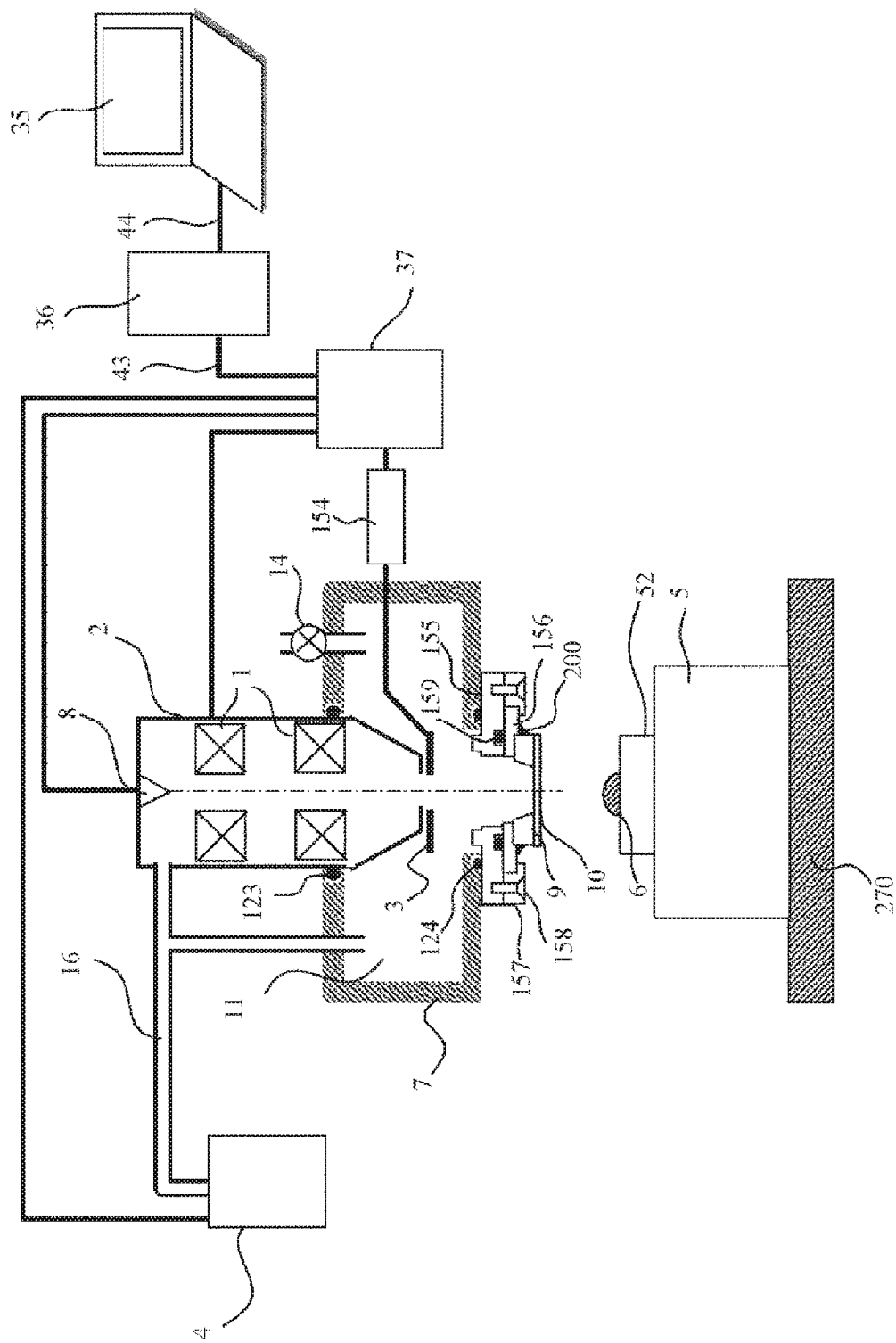
FIG. 8 is a diagram of an entire configuration of the charged particle microscope in which a diaphragm base is used.

FIG. 8 illustrates a configuration in which a diaphragm base 156 is used. In the configuration described above, the base 9 of the diaphragm 10 is fixed to the diaphragm holding member 155 by using the adhesive or the like. Therefore, it is difficult to perform releasing depending on types of adhesives and, as a result, the diaphragm holding member 155 is an expendable component. Therefore, a problem arises in that running costs are increased and waste is increased.

In the present configuration, the base 9 is fixed to the diaphragm base 156. The diaphragm base 156 is attached to the diaphragm holding member 155 through a diaphragm base fixing component 157 by using a fixing member 158 such as a nail or the like. The diaphragm base 156 is detachably held in an airtight manner through the vacuum sealing member 159 such as an O-ring. The diaphragm base 156 is fitted in a hole, a recess (not illustrated), or the like, of the diaphragm holding member 155 and the diaphragm base 156 can be fixed to a predetermined position of the diaphragm holding member 155.

In the present configuration, the diaphragm base 156 is an expendable component; however, the diaphragm base 156 is separated from the diaphragm holding member 155 and requirements for the shape of the diaphragm base 156 are not strict. Thus, it is possible to have a smaller size and a simple shape and it is possible to reduce costs of expendable components and to reduce weight of waste. In a case where the diaphragm base 156 of the present configuration is used, the "diaphragm holding member" is changed to the "diaphragm base" in the description in FIGS. 6 and 7, and thereby it is similarly possible to simply perform the position matching and attachment.

Example 2

Figure 9:
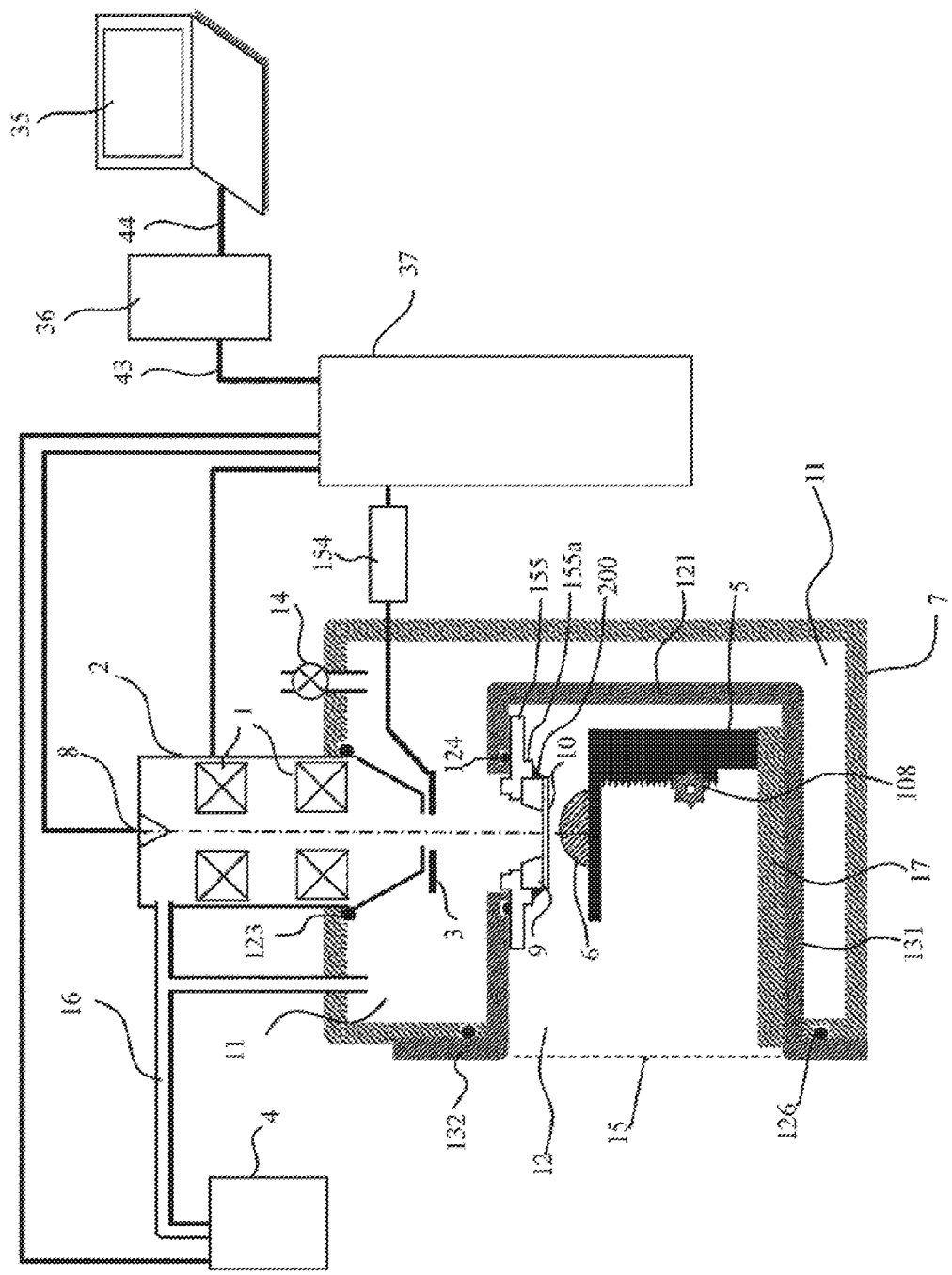
FIG. 9 is a diagram of an entire configuration of a charged particle microscope according to Example 2.

Hereinafter, a configuration of an apparatus in which observation of the sample can be simply performed in the atmosphere by using a common charged particle beam apparatus. FIG. 9 is a diagram of an entire configuration of the charged particle microscope according to the present example. Similar to Example 1, the charged particle microscope of the present example is also configured to include the charged particle optical lens tube 2, the housing (vacuum chamber) 7 which supports the charged particle optical lens tube with respect to an apparatus mounting surface, the sample stage 5, or the like. Since operations and functions of the respective components or additional components added to the respective components are substantially the same as those in Example 1, detailed description thereof is omitted.

The charged particle microscope illustrated in FIG. 9 includes a second housing (attachment) 121 which is used by being inserted into the housing 7 (hereinafter, first housing). The second housing 121 is configured to include a rectangular parallelepiped main body 131 and a matching section 132. As will be described below, at least one side surface of the side surfaces of the rectangular parallelepiped shape of the main body 131 is an opened face 15. The surfaces of the side surfaces of the rectangular parallelepiped shape of the main body 131 other than the surface, on which the diaphragm holding member 155 is provided, may be formed by walls of the second housing 121 or may be formed by the side walls of the first housing 7 in a state in which the second housing 121 does not have a wall and is incorporated in the first housing 7. The position of the second housing 121 is fixed to the side surface or the inner wall surface of the first housing 7 or to the charged particle optical lens tube. The main body 131 has a function of accommodating the sample 6 as an observation target and is inserted into the inside of the first housing 7 through the opening described above. The matching section 132 configures a matching surface to an outer wall surface on the side surface side on which the opening of the first housing 7 is provided and the matching section is fixed to the outer wall surface on the side surface side described above through the vacuum sealing member 126. In this manner, the entire second housing 121 is fitted in the first housing 7. In the simplest way, the opening described above can be formed using the opening for carrying in and out of the sample, which is originally provided in a vacuum sample chamber of the charged particle microscope. In other words, when the second housing 121 is manufactured by matching the size of the hole originally opened and the vacuum sealing member 126 is attached around the hole, the apparatus is minimally modified. In addition, the second housing 121 can be removed from the first housing 7.

The side surface of the second housing 121 is the opened face 15 which communicates with aerial space through at least a plane having a size with which the sample can enter and exit and the sample 6 accommodated inside (on right side from a dotted line in the drawing, hereinafter, referred to as a second space) the second housing 121 is left in the atmospheric pressure state during observation. Further, FIG. 9 is a sectional view of the apparatus in a parallel direction to the optical axis and thus only one surface of the opened face 15 is illustrated; however, when vacuum sealing is performed by the side surface of the first housing in a back direction and a front direction of the paper surface in FIG. 9, the opened face 15 of the second housing 121 is not limited to the one surface. The opened face may be at least one or more surfaces in a state in which the second housing 121 is incorporated in the first housing 7. Meanwhile, the vacuum pump 4 is connected to the first housing 7 such that the closed space (hereinafter, referred to as a first space), which is configured by the inner wall surface of the first housing 7, the outer wall surface of the second housing, and the diaphragm 10, can be subjected to evacuation of air. The diaphragm is disposed such that a pressure in the second space is higher than the pressure in the first space, and thereby, in the present example, the second space can be separated in terms of the pressure. In other words, while the first space 11 is maintained in a high vacuum by the diaphragm 10, the second space 12 is maintained in the atmospheric pressure or in a gas atmosphere having pressure substantially the same as the atmospheric pressure. Therefore, it is possible to maintain the charged particle optical lens tube 2 and the detector 3 in a vacuum state during an operation of the apparatus and it is possible to maintain the sample 6 in the atmospheric pressure. In addition, since the second housing 121 has the opened face, the sample 6 can be freely replaced during the observation.

In a case where the entire second housing 121 is fitted in the first housing 7, on the top surface side of the second housing 121, the diaphragm 10 is provided at a position right below the charged particle optical lens tube 2 described above. The diaphragm 10 can transmit or allow the primary charged particle beam, which is emitted from the lower end of the charged particle optical lens tube 2, to pass therethrough, and the primary charged particle beam finally reaches the sample 6 through the diaphragm 10.

The sample stage 5 is disposed inside the second housing 121 and the sample 6 can freely move.

Also in the apparatus, similar to Example 1, the positioning structure 155a is provided in the diaphragm holding member 155. Since the configuration according to the positioning structure 155a is the same as that in Example 1, detailed description thereof is omitted.

Example 3

Figure 10:
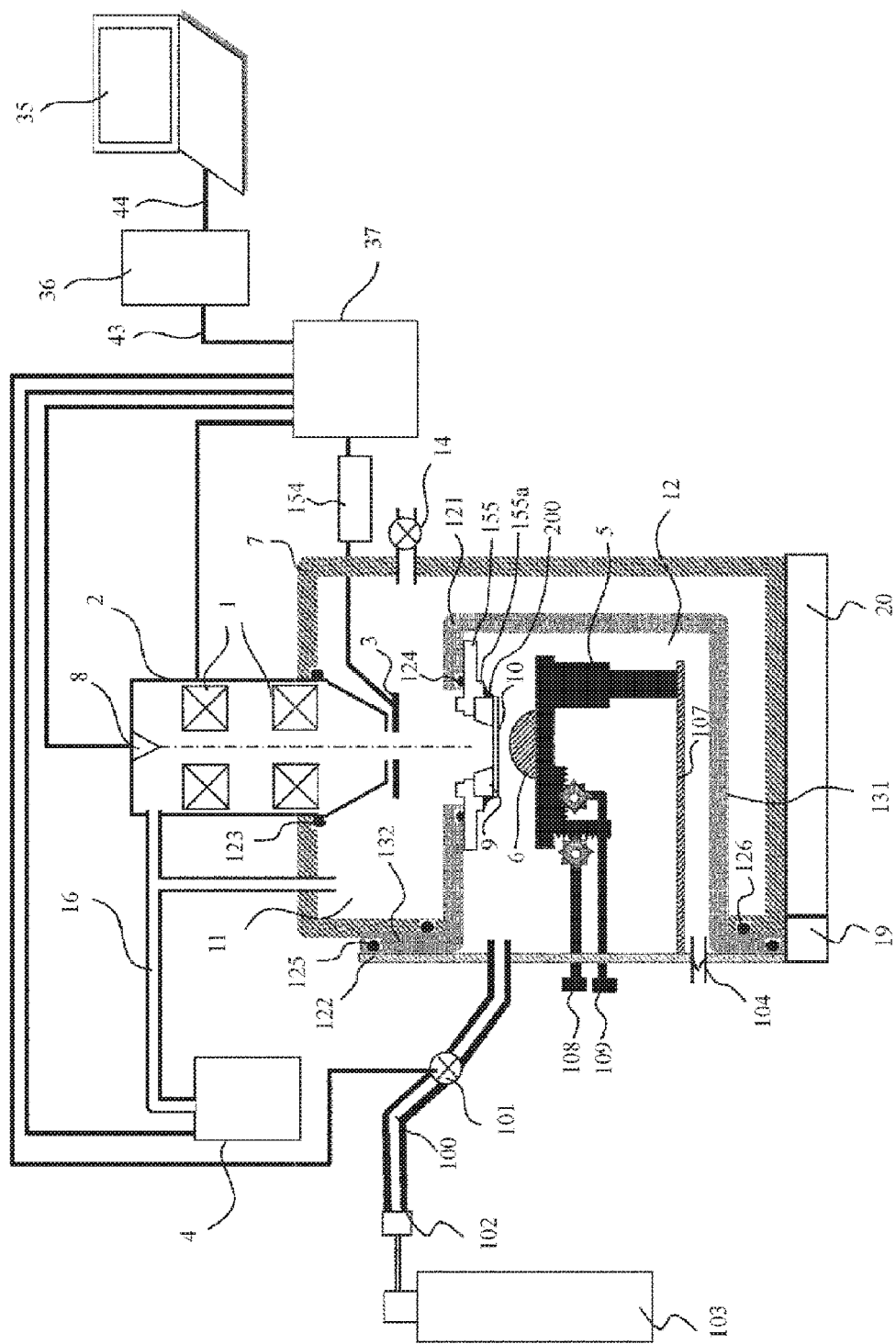
FIG. 10 is a diagram of an entire configuration of a charged particle microscope according to Example 3.

FIG. 10 is a diagram of an entire configuration of the charged particle microscope according to present example. Similar to Examples 1 and 2, the charged particle microscope of the present example is also configured to include the charged particle optical lens tube 2, the first housing (vacuum chamber) 7 which supports the charged particle optical lens tube with respect to an apparatus mounting surface, the second housing (attachment) 121 which is used by being inserted into the first housing 7, the control system, or the like. Since operations and functions of the respective components or additional components added to the respective components are substantially the same as those in Examples 1 or 2, detailed description thereof is omitted.

In the case of the charged particle microscope of the present example, the opened face which forms at least one side surface of the second housing 121 can be covered by a cover member 122, and thus various functions can be realized. Hereinafter, the functions will be described.

<In Terms of Sample Stage>

The charged particle microscope of the present example includes, in the cover member 122, the sample stage 5 as means for causing an observation field to move by changing the position of the sample. In the sample stage 5, an XY drive mechanism in an in-plane direction and a Z-axial drive mechanism in a height direction are provided. A support plate 107 as a bottom plate, which supports the sample stage 5, is attached to the cover member 122 and the sample stage 5 is fixed to the support plate 107. The support plate 107 is attached to extend toward a surface of the cover member 122, which faces the second housing 121, and toward the inside of the second housing 121. Shafts from the Z-axial drive mechanism and the XY drive mechanism extend, respectively, and are continuous to an operation knob 108 and an operation knob 109 which are included in the cover member 122, respectively. The apparatus user adjusts a position of the sample 6 in the second housing 121 by operating the operation knobs 108 and 109.

<In Terms of Near-Sample Atmosphere>

In the charged particle microscope of the present example, there are provided a function of supplying replacement gas into the second housing or a function of forming a pressure state which is different from that in the first space 11 or an outside air outside the apparatus. The charged particle beam emitted from the lower end of the charged particle optical lens tube 2 passes through the first space which is maintained in the high vacuum, and passes through the diaphragm 10 and the sample 6 is irradiated with the charged particle beam. Since the charged particle beam is scattered due to gas molecules in the aerial space, a mean free path is short. In other words, when a distance between the diaphragm 10 and the sample 6 is significant, secondary electrons, reflection electrons, or transmission electrons, or the like, which is produced from the primary charged particle beam and the charged particle beam irradiation do not reach the sample and the detector 3. Meanwhile, a scattering probability of the charged particle beam is proportional to a mass number or density of gas molecules. Accordingly, when the air in the second space is displaced with gas molecules which are lower in the mass number than the atmosphere or evacuation of air is performed to a small extent, the scattering probability of the charged particle beam is lowered and the charged particle beam can reach the sample. In addition, gas displacement or evacuation of air may need to be performed not in the entire second space, but on at least a passing path of the charged particle beam, that is, a space between the diaphragm 10 and the sample 6, in the second space.

For the reasons described above, in the charged particle microscope of the present example, an attachment portion (gas guide portion) of a gas supply pipe 100 is provided in the cover member 122. The gas supply pipe 100 is connected to a gas cylinder 103 by a connection unit 102 and thereby displacement gas is guided into the second space 12. A gas control valve 101 is disposed in the middle of the gas supply pipe 100 and can control a flow rate of displacement gas flowing in a pipe. Therefore, a signal line extends from the gas control valve 101 to the low-rank control unit 37 and the apparatus user can control the flow rate of the displacement gas on an operation screen displayed on a monitor of a computer 35. In addition, the gas control valve 101 may be manually opened and closed.

As types of displacement gases, as long as a gas which is more lightweight than the atmosphere, such as nitrogen or water vapor, is used, an improvement effect of an image S/N ratio is found; however, when a helium gas or a hydrogen gas, which has a more lightweight mass, is used, an improvement effect of an image S/N ratio is increased.

Since the displacement gas is a lightweight element gas, the gas is likely to remain on the upper section of the second space 12 and the gas on the lower side is unlikely to be displaced. Therefore, an opening which communicates, with the inside and the outside of the second space, is provided on the lower side from the attachment position of the gas supply pipe 100 in the cover member 122. For example, in FIG. 10, an opening is provided at the attachment position of a pressure control valve 104. In this manner, since an atmospheric gas is pressed by the lightweight element gas guided from the gas guide path and is discharged from the opening on the lower side, the gas displacement can be efficiently performed in the second housing 121. Further, the opening may serve as a crude exhaust port to be described below.

The pressure control valve 104 may be provided instead of the opening described above. The pressure control valve 104 has a function automatically opening a valve when an internal pressure of the second housing 121 becomes 1 atm or higher. The pressure control valve having such a function is provided, and thus the valve is automatically opened when the internal pressure becomes 1 atm or higher, during the guide of the lightweight element gas. Then, atmosphere gas components such as nitrogen, oxygen, or the like, can be discharged to the outside of the apparatus and the inside of the apparatus is filled with the lightweight element gas. Further, the gas cylinder or the vacuum pump 103 illustrated in the drawings is provided in the charged particle microscope in some cases, and the apparatus user attaches as necessary in some cases.

In addition, in some cases, even the lightweight element gas such as helium gas or hydrogen gas is provided, electron beam scattering is significant. In this case, the gas cylinder 103 may have a vacuum pump. Also, the evacuation of air is performed to the small extent, and thereby the inside of the second housing can be in an extremely low vacuum state (that is, atmosphere having a pressure approximate to the atmospheric pressure). In other words, the space between the diaphragm 10 and the sample 6 can be in a vacuum state. For example, an evacuation port is provided in the second housing 121 or the cover member 122 and the inside of the second housing 121 is subjected to evacuation of air to the small extent. Then, the displacement gas may be guided in. The evacuation in the case may be performed to reduce the atmosphere gas components, which remains inside the second housing 121, so as to be equal to or lower than a certain amount such that there is no need to perform a high evacuation of air but the crude exhaust is sufficient.

In this manner, in the present example, it is possible to control the space in which the sample is disposed such that the space is in any degree of vacuum from the atmospheric pressure of (about $10^5$ Pa) to about $10^3$ Pa. In the low-vacuum scanning electron microscope in the related art, since an electron beam column communicates with a sample chamber, the pressure of the electron beam column is likely to be linked and to be changed when the degree of vacuum of the sample chamber is lowered and the pressure is approximate to the atmospheric pressure, and it is difficult to control the sample chamber to the pressure of the atmospheric pressure (about $10^5$ Pa) to $10^3$ Pa. According to the present example, since the second space and the first space are separated by the thin film, it is possible to freely control the pressure and the types of gases of the atmosphere in the second space 12 surrounded by the second housing 121 and the cover member 122. Accordingly, it is possible to control the sample chamber to have the pressure of the atmospheric pressure (about $10^5$ Pa) to $10^3$ Pa which is difficult to control. Further, it is possible to perform not only observation at the atmospheric pressure (about $10^5$ Pa), but also the observation of the state of the sample, which is obtained by changing the pressure continuously approximate to the atmospheric pressure.

In addition, although not illustrated, the cylinder 103 connects the gas cylinder to the vacuum pump in a complicated manner and may be a composite gas control unit.

In the configuration according to the present example, the second space 12 inside the second housing is closed, compared to the configuration described above. Therefore, it is possible to provide a charged particle beam apparatus in which a gas can be guided through between the diaphragm 10 and the sample 6 or evacuation of air can be performed <Other Configurations>

As described above, in the present example, all of the sample stage 5, the operation knobs 108 and 109, the gas supply pipe 100, and the pressure control valve 104 are collectively attached to the cover member 122. Accordingly, the apparatus user can perform an operation of the operation knobs 108 and 109, a replacement operation of the sample, or operations of the gas supply pipe 100 or the pressure control valve 104 on the same surface as the first housing. Hence, operability is significantly improved, compared to the charged particle microscope having a configuration in which the components are separately attached to other surfaces of the sample chamber.

In addition to the configuration described above, a contact monitor which detects a contact state of the second housing 121 and the cover member 122 is provided, and it is monitored that the second space is closed or opened.

In addition to the secondary electron detector or the reflection electron detector, an X-ray detector or a light beam detector may be provided and an EDS analysis or detection of a fluorescence line can be performed. The X-ray detector or the light beam detector may be arranged in any of the first space 11 and the second space 12.

Similar to Example 1, the positioning structure 155a is provided in the diaphragm holding member 155. Since the configuration related to the positioning structure 155a is the same as in Example 1, detailed description thereof will be omitted.

As above, according to the present example, in addition to the effects in the Examples 1 and 2, from an atmosphere gas to the displacement gas can be guided. In addition, the observation of the sample can be performed in the atmosphere having a pressure which is different from the first space. In addition, the diaphragm is removed and the first space communicates with the second space. Therefore, the SEM is realized which is capable of, in addition to the observation in the atmosphere or in a predetermined gas atmosphere, the sample observation in a vacuum state which is the same as that of the first space.

Further, the present invention is not limited to Examples and includes various modification examples. For example, Examples are described in detail, in order to describe the present invention in an easily understandable manner, and Example is not limited to the combination of entire configuration described above. In addition, a part of a configuration of one Example can be replaced with another configuration of another Example and one configuration of one Example can be added to another configuration of another Example. In addition, a part of the configuration of the respective Examples can be added to, removed from, or replaced with another configuration. In addition, a part of all of the respective configurations, functions, processing units, processing means may be realized as hardware by designing an integrated circuit. The respective configurations, functions, or the like, may be realized as software by interpreting and executing a program in which a processor realizes the respective functions.

Information of a program which realizes the respective functions, a table, a file, or the like, can be stored in a recording device such as a memory, a hard disc, or a solid state drive (SSD) or can be stored in a recording medium such as an IC card, SD card, or an optical disk.

In addition, the control line or the information line is shown as considered to be necessary and there is no need to show all of the control line or information line depending on a product. Actually, it may be considered that substantially the entire configurations is connected to one another.

REFERENCE SIGNS LIST

1: optical lens
2: charged particle optical lens tube
3: detector
4: vacuum pump
5: sample stage
6: sample
7: housing
8: charged particle source
9: base
10: diaphragm
11: first space
12: second space
14: leak valve
15: opened face
16: vacuum pipe
35: computer
36: high-rank control unit
37: low-rank control unit
43, 44: communication line
52: sample base
100: gas supply pipe
101: gas control valve
102: connection unit
103: gas cylinder or vacuum pump
104: pressure control valve
107: support plate
108, 109: operation knob
121: second housing
122: cover member
123, 126: vacuum sealing member
131: main body
132: matching section
154: signal amplifier
155: diaphragm holding member
155a: structure
155b: avoiding shape
155c: tapered shape
156: diaphragm base
157: diaphragm base fixing component
158: nail
159: vacuum sealing member
200: adhesive
201: pressing member
201a: avoiding section
201b: weight
202, 203: structural frame
204: base plate
204a: positioning shape
205, 206: vacuum sealing member
207: joint
208: pipe
209: vacuum pump
210: through-hole
250: step 1
251: step 2
253: step 3
254: step 5
270: base

The invention claimed is:

1. A diaphragm attaching member that is mounted in a charged particle beam apparatus including a charged particle optical lens tube which irradiates a sample with a primary charged particle beam, a housing which forms a part of the charged particle beam apparatus and the inside of which is subjected to evacuation of air so as to be in a vacuum state by a vacuum pump, and a diaphragm which enables a space, which is subjected to the evacuation of air so as to be in a vacuum state, to maintain an airtight state, and which transmits or allows the primary charged particle beam to pass therethrough, the diaphragm attaching member comprising:
   a diaphragm mounting portion to which a TEM target membrane, which is held in a base having the external shape with the longest portion of 2.8 mm to 3.2 mm in length, is attached as the diaphragm; and
   a housing fixing portion which is attached to the housing of the charged particle beam apparatus;
   wherein the diaphragm mounting portion has a convex shape.

2. The diaphragm attaching member according to claim 1, wherein the maximum length of a diagonal of the diaphragm mounting portion is 2.8 mm to 3.2 mm.

3. The diaphragm attaching member according to claim 1, wherein the diaphragm mounting portion has a positioning structure with a shape which is paired with an external shape of the base.

4. The diaphragm attaching member according to claim 3, wherein the positioning structure is an at-least-two-step structure having wall surfaces in a thickness direction of the diaphragm attaching member,
   wherein the respective wall surfaces of the two-step structure are not parallel to each other, and
   wherein at least one point of the outer circumference of the base is in contact with each wall surface.

5. The diaphragm attaching member according to claim 3, wherein the positioning structure is a convex portion or a concave portion having a circular shape with a diameter which is the same in size as the maximum length of the diagonal of the external shape of the base.

6. The diaphragm attaching member according to claim 3, wherein the positioning structure is a convex portion or a concave portion which is the same as the external shape of the base.

7. The diaphragm attaching member according to claim 3, wherein the diameter or the maximum length of the diagonal of the positioning structure is less than that of the external shape of the base.

8. The diaphragm attaching member according to claim 3,
wherein the diameter or the maximum length of the diagonal of the positioning structure is greater than that of the external shape of the base, by a permissible amount of error of the attachment position of the diaphragm.

9. The diaphragm attaching member according to claim 1, further comprising:
an opening which penetrates the diaphragm attaching member in a thickness direction, in a surface to which the diaphragm is attached,
wherein an area of the opening on the side of the surface, on which the diaphragm is mounted, is less than an area of the opening on the side of a surface opposite to the surface on which the diaphragm is mounted.

10. The diaphragm attaching member according to claim 9,
wherein the opening has a conic shape which is radially widened from the surface on which the diaphragm is mounted.

11. A charged particle beam apparatus comprising:
a charged particle optical lens tube which irradiates a sample with a primary charged particle beam;
a housing which forms a part of the charged particle beam apparatus and the inside of which is subjected to evacuation of air so as to be in a vacuum state by a vacuum pump; and
a diaphragm which enables a space, which is subjected to the evacuation of air so as to be in a vacuum state, to maintain an airtight state, and which transmits or allows the primary charged particle beam to pass therethrough; and
a diaphragm attaching member for attaching the diaphragm to the housing,
wherein the diaphragm attaching member has
a diaphragm mounting portion to which a TEM target membrane, which is held in a base having the external shape with the longest portion of 2.8 mm to 3.2 mm in length, is attached as the diaphragm, and
a housing fixing portion which is attached to the housing of the charged particle beam apparatus;
wherein the diaphragm mounting portion has a convex shape.

12. A diaphragm attaching jig that is used when a diaphragm, which transmits or allows a primary charged particle beam to pass therethrough, and which separates a space in a non-vacuum atmosphere from a vacuum space, is attached to a diaphragm attaching member which is attached to a housing of a charged particle beam apparatus which irradiates a sample in the non-vacuum atmosphere, with the primary charged particle beam, the diaphragm attaching jig comprising:
a base plate having a diaphragm attaching member mounting portion in which the diaphragm attaching member is mounted; and
a pressing member that is provided perpendicularly above the diaphragm attaching member mounting position and that moves in a perpendicular direction such that the pressing member presses a base in which the diaphragm is held, and which is mounted on the diaphragm attaching member,
wherein the base plate has a positioning structure that regulates a setting position of the diaphragm attaching member such that the center of an opening of the diaphragm attaching member is positioned on a central axis of the pressing member; and wherein the diaphragm attaching member mounting portion has a convex shape.

13. The diaphragm attaching jig according to claim 12,
wherein the base plate has a through-hole provided in the diaphragm attaching member mounting portion,
wherein at least a part of one end of the through-hole is closed by the diaphragm, and
wherein a vacuum pump connecting portion, which directly or indirectly connects the vacuum pump, is formed in the other end of the through-hole.

14. A diaphragm attaching method that is used when a diaphragm, which transmits or allows a primary charged particle beam to pass therethrough, and which separates a space in a non-vacuum atmosphere from a vacuum space, is attached to a diaphragm attaching member which is attached to a housing of a charged particle beam apparatus which irradiates a sample in the non-vacuum atmosphere, with the primary charged particle beam, the diaphragm attaching method comprising:
a step of mounting the diaphragm attaching member such that the center of an opening of the diaphragm attaching member is positioned on a predetermined position;
a step of mounting a base, in which the diaphragm is held, on the diaphragm attaching member;
a step of moving a pressing member perpendicularly downward, which is mounted perpendicularly above the diaphragm attaching member mounting position and pressing the base, in which the diaphragm is held and which is mounted on the diaphragm attaching member, by the pressing member; and
a step of adhering of the diaphragm to the diaphragm attaching member, while pressing the base, in which the diaphragm is held, to the diaphragm attaching member,
wherein, in the step of mounting the diaphragm attaching member, the diaphragm attaching member is mounted such that the center of an opening of the diaphragm attaching member is positioned on a central axis of the pressing member; and
wherein the diaphragm attaching member has a convex shape.

15. The diaphragm attaching method according to claim 14, further comprising:
a step of causing a space having a side surface, at least a part of which is formed of the diaphragm, to be in a vacuum state, and inspecting a quality of the diaphragm.

16. A diaphragm attaching member that is mounted in a charged particle beam apparatus including a charged particle optical lens tube which irradiates a sample with a primary charged particle beam, a housing which forms a part of the charged particle beam apparatus and the inside of which is subjected to evacuation of air so as to be in a vacuum state by a vacuum pump, and a diaphragm which enables a space, which is subjected to the evacuation of air so as to be in a vacuum state, to maintain an airtight state, and which transmits or allows the primary charged particle beam to pass therethrough, the diaphragm attaching member comprising:
a diaphragm mounting portion to which a TEM target membrane, which is held in a base having the external shape with the longest portion of 2.8 mm to 3.2 mm in length, is attached as the diaphragm; and
a housing fixing portion which is attached to the housing of the charged particle beam apparatus;
wherein the diaphragm mounting portion has a positioning structure with a shape which is paired with an external shape of the base; and wherein the diameter or the maximum length of the diagonal of the positioning structure is greater than that of the external shape of the base, by a permissible amount of error of the attachment position of the diaphragm.

\* \* \* \* \*